(12) United States Patent
Rajsuman

(10) Patent No.: US 6,948,105 B2
(45) Date of Patent: Sep. 20, 2005

(54) METHOD OF EVALUATING CORE BASED SYSTEM-ON-A-CHIP (SOC) AND STRUCTURE OF SOC INCORPORATING SAME

(75) Inventor: Rochit Rajsuman, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 821 days.

(21) Appl. No.: 09/853,999

(22) Filed: May 12, 2001

(65) Prior Publication Data

US 2002/0170007 A1 Nov. 14, 2002

(51) Int. Cl.⁷ .................. G01R 31/28; G06F 17/50; H01L 23/495
(52) U.S. Cl. .................. 714/724; 716/4; 257/672
(58) Field of Search .................. 714/724; 716/4; 257/672

(56) References Cited

U.S. PATENT DOCUMENTS 6,218,726 B1 * 4/2001 Chang et al. .............. 257/672
6,249,893 B1 * 6/2001 Rajsuman et al. ......... 714/741
6,484,280 B1 * 11/2002 Moberly .................... 714/726
2003/0056163 A1 * 3/2003 Rajsuman et al. ......... 714/724

* cited by examiner

Primary Examiner—Guy Lamarre
Assistant Examiner—Cynthia Britt
(74) Attorney, Agent, or Firm—Muramatsu & Associates

(57) ABSTRACT

A method of debugging an individual core in core based system-on-a-chip (SOC) ICs with high accuracy and observability, and a structure of SOC incorporating the method. The method includes the steps of building two or more metal layers of a pad frame for each core in an SoC while connecting I/O (input and output) pads on a lower metal layer to a top metal layer, thereby exposing all I/O pads and power pads on a surface of the top metal layer of the pad frame of each core, and applying test vector to each core through the I/O pads on the top metal layer of the core and evaluating response outputs of the core received through the I/O pads on the top metal layer.

6 Claims, 6 Drawing Sheets

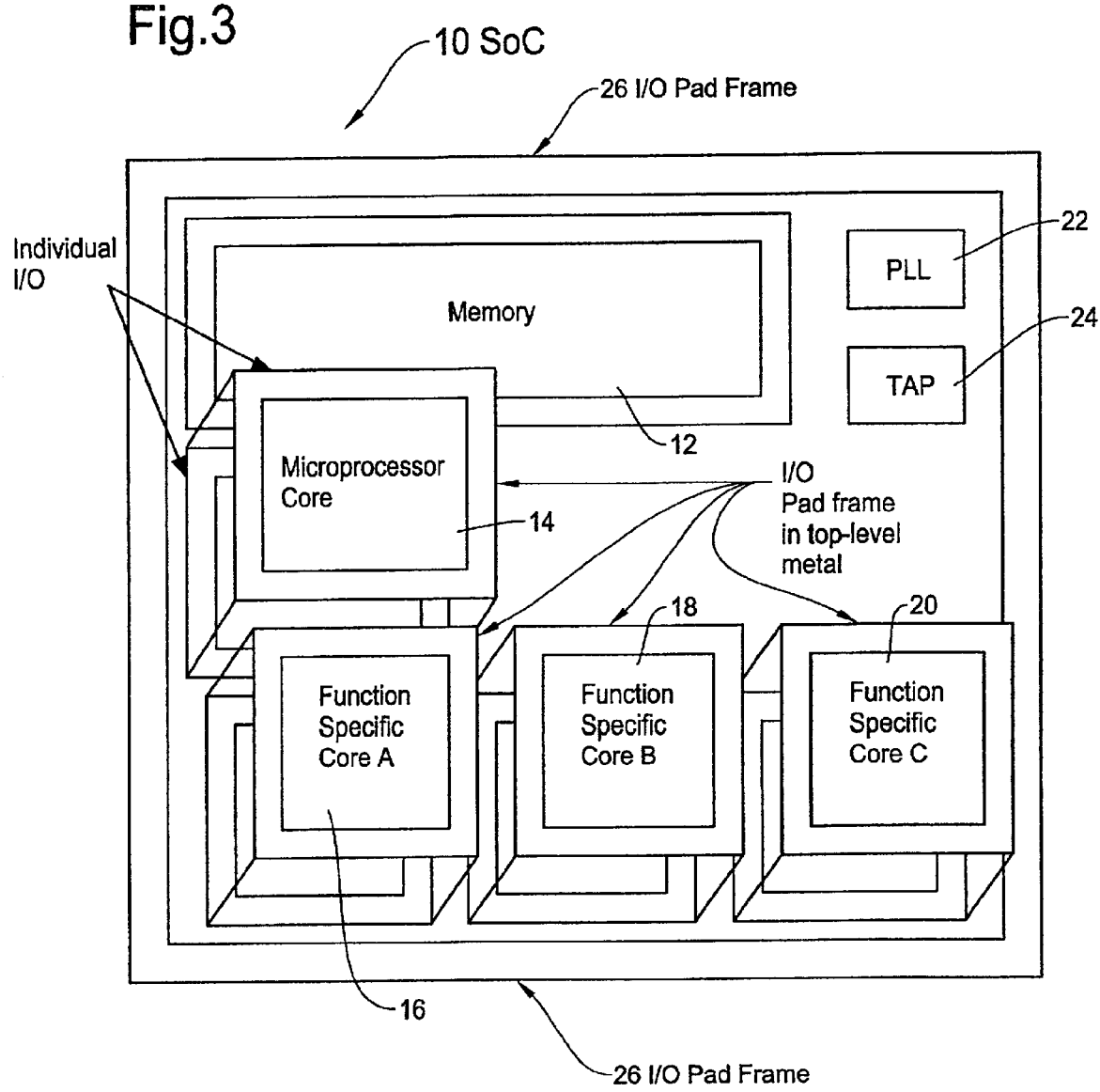

METHOD OF EVALUATING CORE BASED SYSTEM-ON-A-CHIP (SOC) AND STRUCTURE OF SOC INCORPORATING SAME

FIELD OF THE INVENTION

This invention relates to a method of testing semiconductor devices, and more particularly, to a method of debugging design integrity of core based system-on-a-chip (SoC) ICs in a silicon form (silicon debug) with high accuracy and observability. The present invention also relates to a structure of SoC IC implementing the method of silicon debug.

BACKGROUND OF THE INVENTION

In recent several years, ASIC (Application Specific Integrated Circuit) technology has evolved from a chip-set philosophy to an embedded cores based system-on-a-chip (SoC). An SoC is an IC designed by stitching together multiple stand-alone VLSI designs (cores) to provide full functionality for an application. Namely, the SoCs are built using pre-designed models of complex functions known as "cores" (also known as Intellectual Property or IP) that serve a variety of applications. These cores are generally available either in high-level description language (HDL) such as in Verilog/VHDL (known as soft-cores), or in transistor level layout such as GDS II (known as hard-cores) An SoC may contain combinations of hard and soft cores for on-chip functions such as microprocessors, large memory arrays, audio and video controllers, modem, internet tuner, 2D and 3D graphics controllers, DSP functions, and etc.

After the design stage conducted under EDA (electronic design automation) environment, the SoC design is implemented in the form of a silicon chip. This invention is directed to a methodology for evaluating the SoC design in the form of silicon ("silicon debug") for each of the cores in the SoC. While such system-chips serve for broad applications, the complexity of these chips is far too complex to be tested by conventional means. ("Testing embedded cores" A D&T Roundtable, IEEE Design and Test, pp. 81–89, April-June 1997, "Challenge of the 90's Testing CoreWare based ASICs" Panel on "DFT for embedded cores", R. Rajsuman, International Test Conference, pp. 940, 1996).

In addition to the difficulties in the production testing, these SoCs also present major difficulty in determining their functional correctness when prototype silicon is manufactured. The primary cause of the difficulty is limited observability and controllability of individual cores. In general, only the chip I/Os (input and output of SoC chip) are accessible to apply a test vector or to observe a response to the test vector while I/Os of each embedded core is not accessible. Thus, in a complex SoC, many internal faults do not show-up at the chip I/Os.

FIG. 1 illustrates an example of general structure of SoC 10 that has an embedded memory 12, a microprocessor core 14, and three function-specific cores 16, 18 and 20, PLL (phase lock loop) 22 and TAP (test access port) 24. The overall testing of SoC can be done only through the chip-level I/Os. In this example, such chip level I/Os are established as chip I/O pads 28 formed on an I/O pad frame 26 at the outer periphery of SoC 10. Each of the functional cores 12, 14, 16, 18 and 20 includes a pad frame 29 which is typically contains multiple I/O pads of cores at core periphery. Generally, in IC design, the top metal layer is used for only power pads 32 for power sources while intermediate metal layers are used for I/O or signal pads for interfacing with other cores, microprocessor core and embedded memory.

In case of a failure, it is extremely important to know the cause of failure, such as if it is due to the microprocessor core 14 or the function specific cores 16, 18 or 20, or other causes. The reason that debugging the failure is necessary is that the failure must be corrected before the SoC design is sent to mass production.

To debug the failure, it is extremely desirable that the individual I/Os of each core are accessible so that core specific test patterns can be applied. At the present time, IEEE P1500 working group is developing a solution so that core I/Os become accessible. This solution is based upon use of extra logic that includes a shift-register based wrapper at the core I/Os and a data transport bus from chip I/Os to core I/Os ("Preliminary outline of the IEEE P1500 scalable architecture for testing embedded cores", IEEE VLSI Test Symposium, 1999). This structure is illustrated in FIGS. 2A–2C where FIG. 2A shows an overall wrapper structure at the outer boundary of the core and FIGS. 2B and 2C respectively show structures of input cell 42 and output cell 44 in the wrapper of FIG. 2A.

Similar solutions based upon core wrapper and data transport logic have also been proposed by the Virtual Socket Interface Alliance (VSIA) and other researchers (Manufacturing related test development specification 1", version 1.0, VSI Alliance, 1998, "Test access architecture" VSI Alliance, 2000, and "Hierarchical test access architecture for embedded cores in an integrated circuit", D. Bhattacharya, IEEE VLSI Test Symposium, pp. 8–14, 1998).

The major drawbacks in these methods are that they require extra logic that increases chip size and hence the cost; and performance penalty because of the wrapper at the core I/Os. An example of such performance penalty includes signal propagation delays in SoC because of the additional circuit components and paths. Also, in all cases, a test vector is shift-in the wrapper register and response is shifted-out using multiple clock cycles. Until the response of previous vector is completely shifted-out, a new test vector cannot be applied. Hence, in all these solutions, testing time become too long and at-speed testing of core cannot be done. This also means that timing related failures cannot be debugged with these solutions.

Another conventional approach is a "bed of nails" type method described in U.S. Pat. Nos. 4,749,947 and 4,937,826. In this method, a grid of wires is created on which the functional circuit to be tested is placed. Every node in the functional circuit can be accessed by a vertical transistor that can provide connection from node to the grid-wires. In principle, this method provides 100% observability. However, this method is extremely expensive as it requires multiple additional steps (layout masks) and modification in the existing manufacturing process of SoC. Also, because of the presence of grid of wires, it significantly increases circuit parasitic capacitance and results in performance penalty.

As in the foregoing, the conventional technologies are not satisfactory for fully debugging individual core in SoC without drawbacks such as increasing the size and cost or involving the performance penalty.

SUMMARY OF THE INVENTION

It is, therefore, an object of the present invention to provide a method of debugging an individual core in a system-on-a-chip (SoC) that is simple to implement and free from the drawbacks of existing methods.

It is another object of the present invention to provide a method of debugging an individual core in a system-on-a-chip (SoC) without requiring any extra logic in the core and thus involving no performance penalty.

It is a further object of the present invention to provide a structure of I/O pad frame for an individual core in a system-on-a-chip (SoC) that enables to access each core through traditional contact probes to applying test vectors to the core and receiving responses therefrom.

In the present invention, the I/O pad-frame of each core is duplicated in the top-level metal during the prototype manufacturing. Consequently, the I/O interface of individual core can be used for test signal application and response signal observation. The present invention makes it possible to apply a core test pattern directly to a particular core rather than an SoC chip as a whole.

One aspect of the present invention is a method of evaluating a system-on-a-chip (SoC). The method is comprised of the steps of building two or more metal layers of a pad frame for each core in an SoC while connecting I/O (input and output) pads on a lower metal layer to a top metal layer, thereby exposing all I/O pads and power pads on a surface of the top metal layer of the pad frame of each core, and applying test vector to each core through the I/O pads on the top metal layer of the core and evaluating response outputs of the core received through the I/O pads on the top metal layer.

In another aspect of the present invention, the method of evaluating an SoC is comprised of the steps of building a chip I/O (input and output) frame at an outer area of the SoC for interfacing with the SoC through contact pads formed thereon, building two or more metal layers of a pad frame for each core in the SoC while connecting I/O pads on a lower metal layer to a top metal layer, thereby exposing all I/O pads and power pads on a surface of the top metal layer of the pad frame of each core, applying test vector to the SoC through the contact pads formed on the chip I/O pad frame and evaluating response outputs of the SoC received through the contact pads on the chip I/O pad frame, and applying test vector to each core through the I/O pads formed on the top metal layer of the core and evaluating response outputs of the core received through the I/O pads on the top metal layer.

The further aspect of the present invention is a structure of an SoC for evaluating design integrity thereof. The structure is comprised of a chip I/O (input and output) frame at an outer area of the SoC for interfacing with the SoC through contact pads formed thereon, and two or more metal layers of a pad frame for each core in the SoC where I/O pads on a lower metal layer are connected to a top metal layer, thereby exposing all I/O pads and power pads on a surface of the top metal layer of the pad frame of each core. Under such a structure of the SoC, test vectors are applied to the SoC through the contact pads formed on the chip I/O pad frame to evaluate response outputs of the SoC received through the contact pads on the chip I/O pad frame, and test vectors are applied to each core through the I/O pads formed on the top metal layer of the core to evaluate response outputs of the core received through the I/O pads on the top metal layer.

According to the present invention, the silicon debug method does not require any additional test circuitry. It does not require any design modification in the chip design, there is no performance penalty and core test pattern can be applied at-speed to debug any functional and timing related fault. During debug, user can apply any type of test patterns to obtain full fault diagnosis (such as identification of failed bit location in embedded memory) without any extra hardware.

These and still other objects and advantageous features of the present invention will become more apparent from the following description of the preferred embodiments when taken in conjunction with the accompanying drawings.

BRIEF DESCRIPTION OF THE DRAWINGS

FIG. 3 is a schematic block diagram showing an example of structure in building a multiple layers of input and output (I/O) frames for each core in SoC in accordance with the present invention.

DETAILED DESCRIPTION OF THE INVENTION

Referring now to FIGS. 3 and 4, there is shown a basic concept in the present invention to establish an I/O interface for each core that can be directly accessible by traditional contact probes. In the present invention, the I/O interface of an individual core can be used for test signal application and response signal observation. Consequently, it is able to apply a core test pattern (rather than a chip test pattern) directly to a particular core, i.e., it is only necessary to access the I/Os of the core.

More specifically, as shown in FIGS. 3 and 4, the I/O pad-frame of each core is duplicated in the top-level metal during the prototype manufacturing. As noted above with reference to the prior art technology, the top-level metal layer of the I/O pad frame is generally used only for routing power lines, and lower level metal layers are used for routing signals including I/Os. Thus, it is not possible to access the individual core through the I/O pad frame of individual core.

In the present invention, however, for a manufacturing process that supports plural layers of metal, an I/O pad-frame of each core is duplicated upwardly for all of the metal layers to the top layer. As shown in FIG. 3, I/Os of each core are brought-up to the top-level metal of the SoC without using any logic or complex sense structure. Thus, the I/O pad-frame of each core can be accessed by contact probes without any intervention. For simplicity of illustration, I/O pads at the top-level metal are omitted.

Figure 4A:
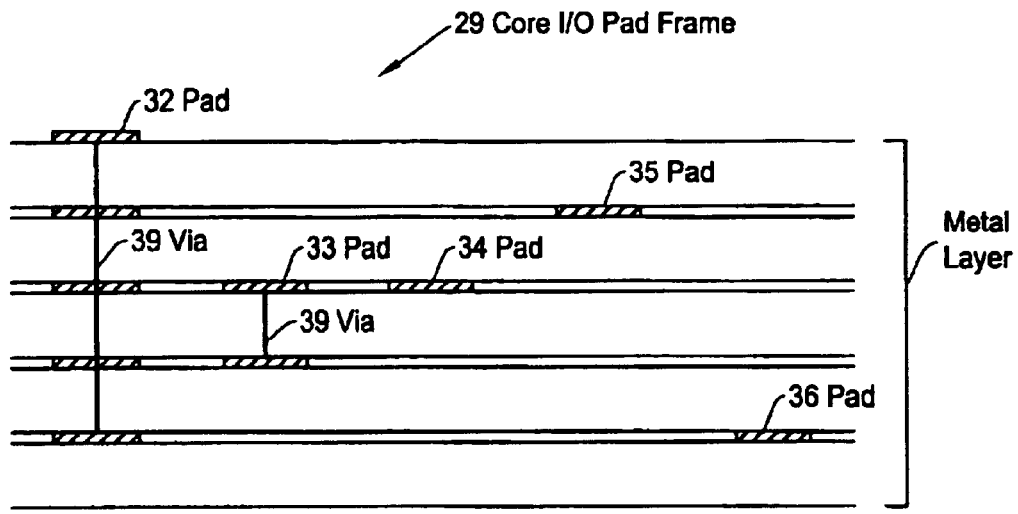
FIG. 4A shows a structure of conventional core I/O pad frame.
Figure 4B:
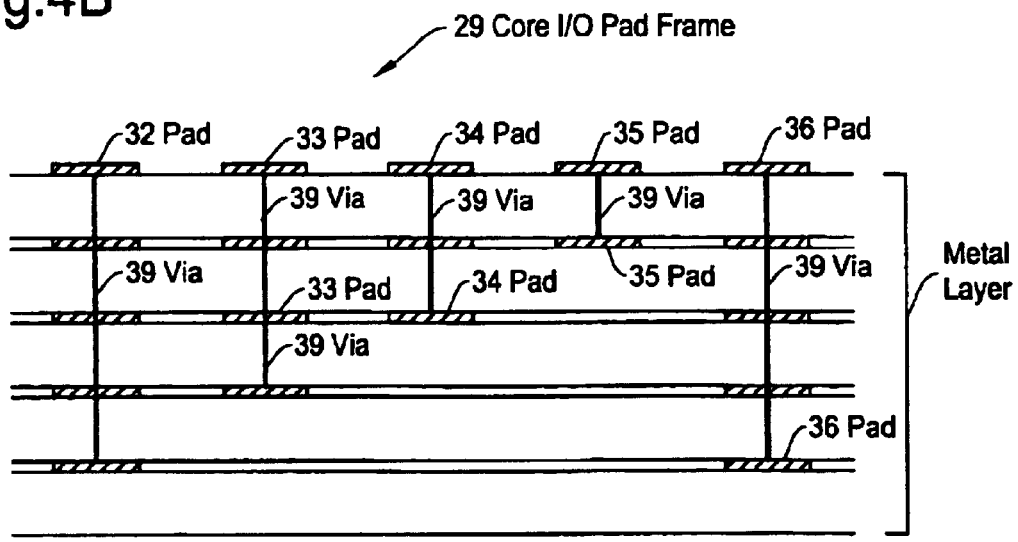
FIG. 4B shows an example of structure in the core I/O pad frame in the present invention.

FIGS. 4A and 4B show a case where five metal layers are used for forming the I/O frame. FIG. 4A is directed to the conventional structure in the I/O frame while FIG. 4B is directed to the I/O frame structure in the present invention. In the conventional technology of FIG. 4A, only the power pad 32 is connected to the top metal layer through vias 39. The pads 33–36 for signals and controls are hidden in the lower metal layers. In the present invention of FIG. 4B, all of the pads 32–36 in any layers are connected to the top metal layer through vias 39. Thus, all the pads 32–36 in the lower layers are duplicated to the top (5th) layer metal as shown in FIG. 4B. The connection to actual I/Os of the core to this duplicated metal pad-frame is made through the vias 39 in other layers.

Figure 1:
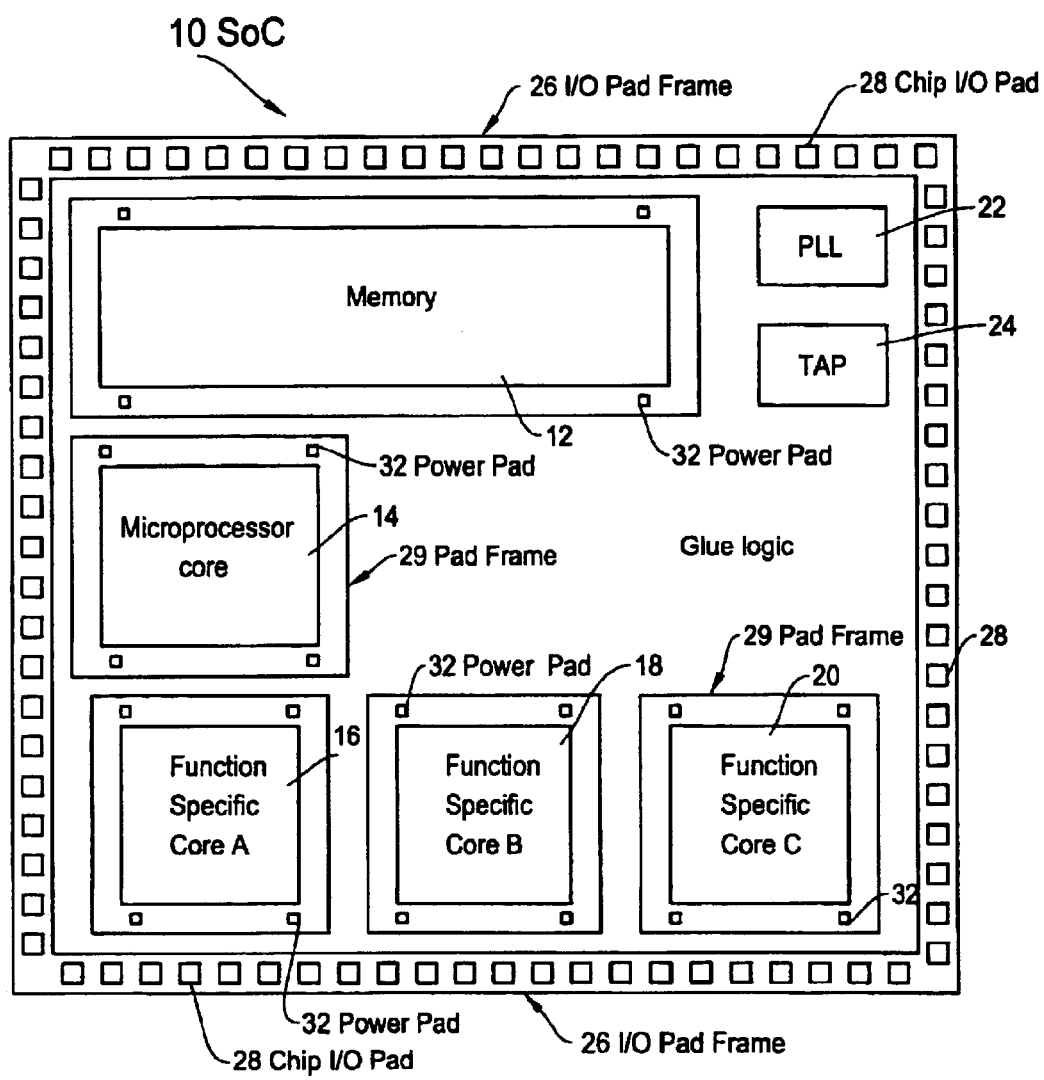
FIG. 1 is a schematic block diagram showing an example of structure in an embedded core based system-on-a-chip (SoC) including memory, microprocessor and function specific cores.
Figure 2A:
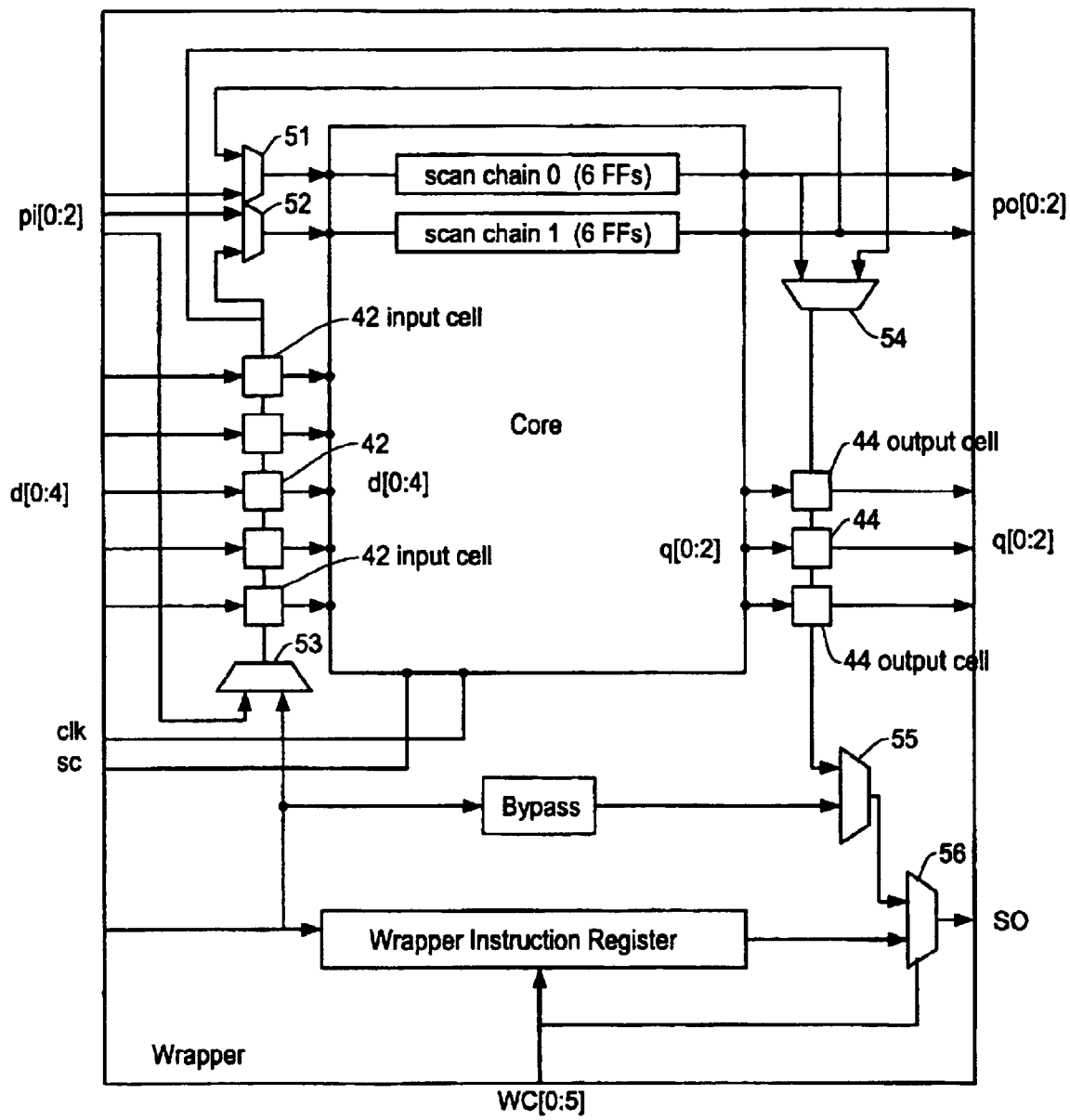
FIG. 2A is an example of overall wrapper structure proposed by IEEE P1500 working group for accessing an individual core in SoC.
Figure 2B:
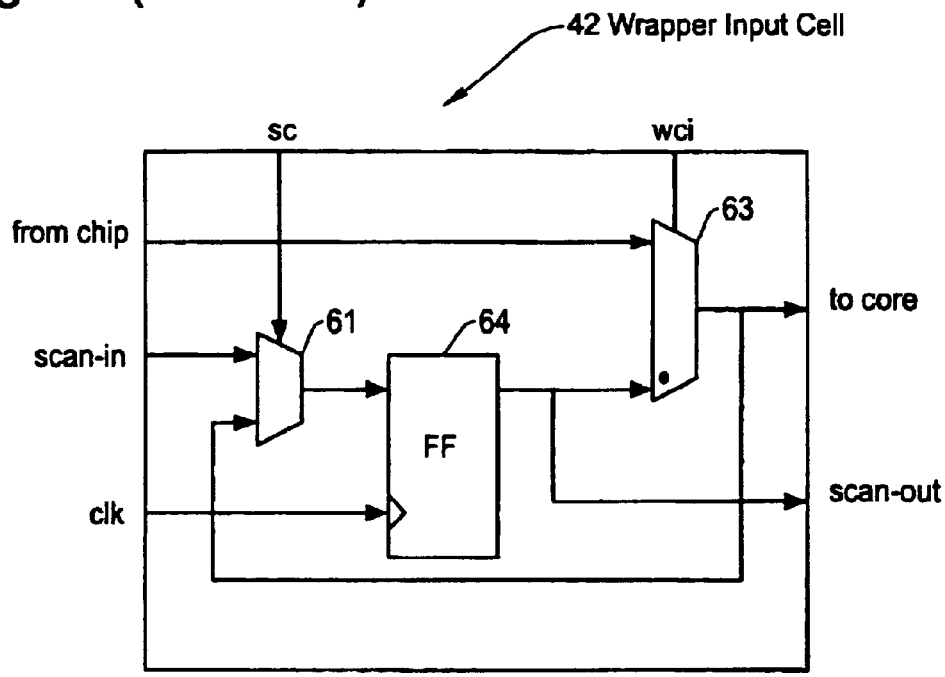
FIG. 2B is an example of structure in an input cell in the wrapper structure of FIG. 2A.
Figure 2C:
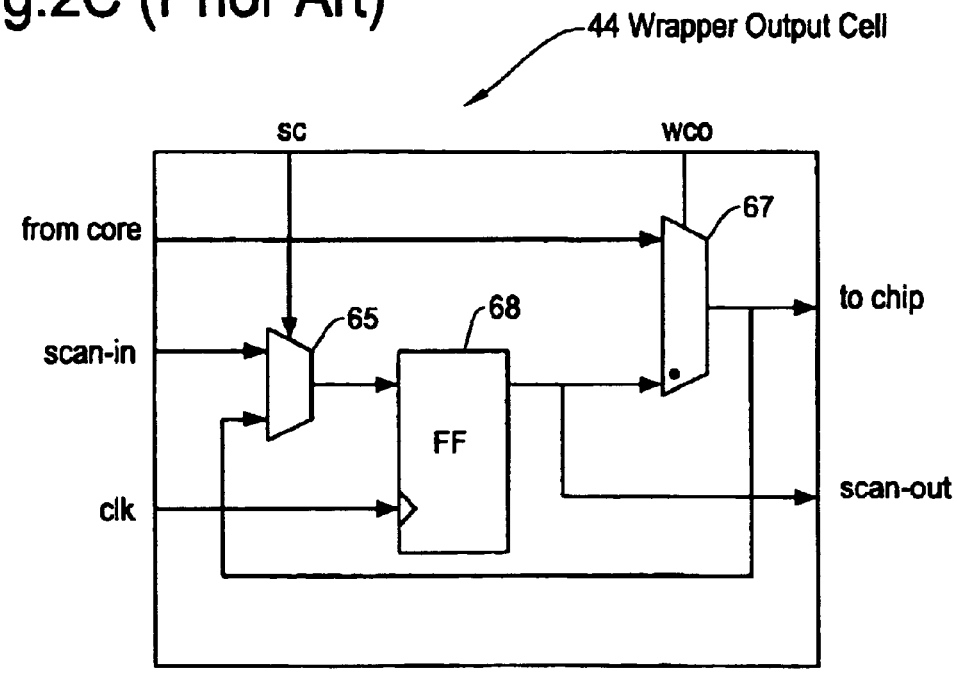
FIG. 2C is an example of structure in an output cell in the wrapper structure of FIG. 2A.

Since I/O pads of each core are brought-up to the top-level metal of the SoC without using any logic or complex sense structure, the top metal layers become simple connection points to the actual I/O pads of the core. Although the top-level metal layer of SoC 10 shown in FIG. 1 has only power pads, the top-level metal of SoC shown in FIG. 5 has all I/O pads and power pads. Although not shown in FIG. 5, PLL core 22 and TAP core 24 are similarly configured in the I/O pad frame to have all of I/O pads and power pads of the cores at the top level metal.

This structure allows complete access to each individual core in the SoC. For example, during the testing of prototype SoC, if a failure is encountered, each core can be probed individually or together with other cores (using a probe card) through the top metal level I/O pad frame. As all I/Os of the core can be probed, the core test vectors can be applied to determine if a particular core is faulty.

When the testing of prototype design is completed and it is ready for mass production, the probe points in top-level metal layer can either be left as-is or can be removed as desired. The removal of probe points is easily accomplished by changing the top-level metal mask and by removing the metal vias without any significant effort. Even when these probe points are not removed from the design, they do not cause any adverse effect on the design. The only advantage of removing these probe points is that the top-level metal layer also become available for the routing and hence, routing of the SoC can be simplified.

Figure 5:
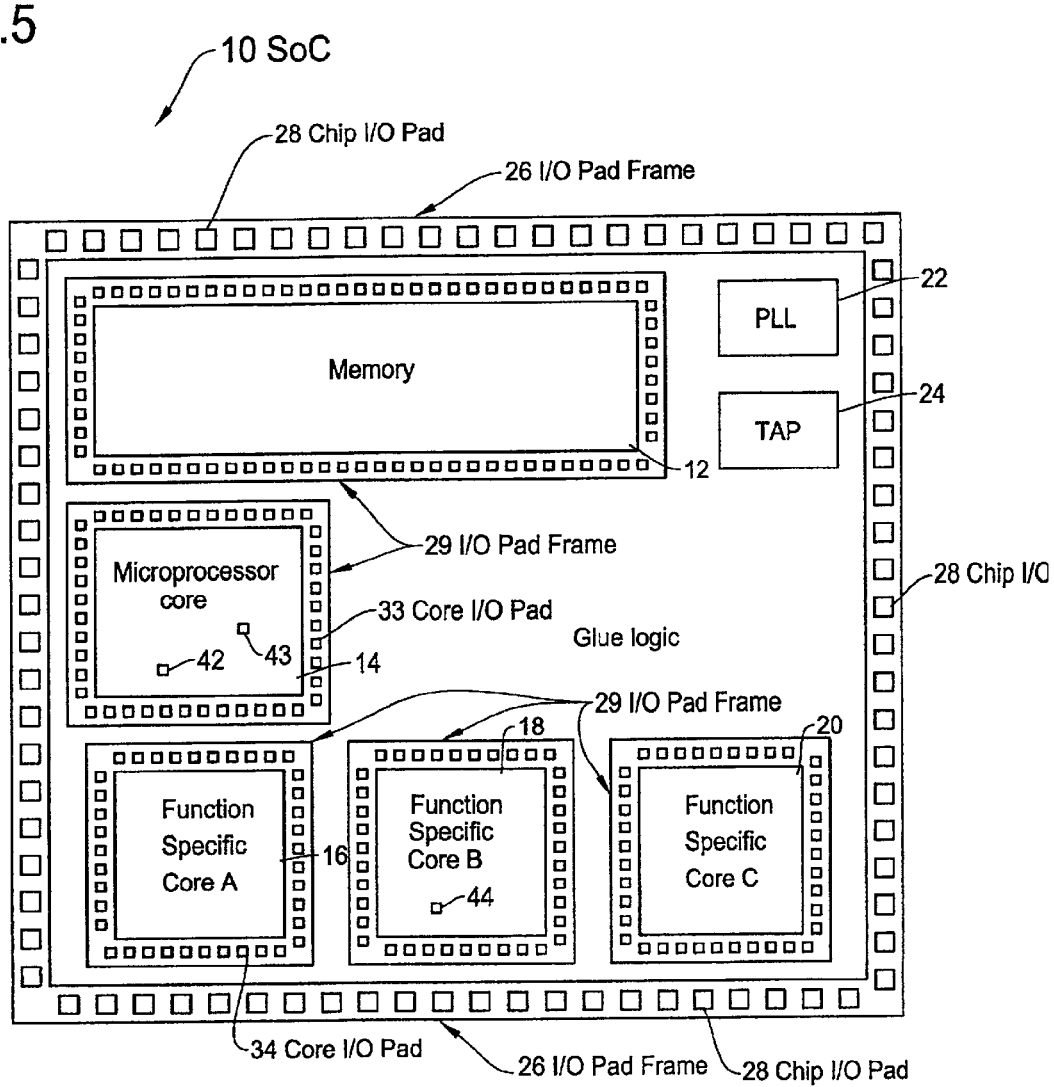
FIG. 5 is a schematic block diagram showing an example of structure in SoC of the present invention having I/O pad frames in top metal layers of the cores.

It should be noted that, using this concept, any internal circuit node (logic node) can also be brought-up at the top level metal layer shown as pads 42, 43 and 44 in FIG. 5. Thus, this method is applicable to access internal circuit nodes if such access is necessary.

As has been describe above, the major advantage of the present invention is that no additional test circuitry is required. It does not require any design modification in the chip design, there is no performance penalty and core test pattern can be applied at-speed to debug any functional and timing related fault. During debug, user can apply any type of test patterns to obtain full fault diagnosis (such as identification of failed bit location in embedded memory) without any extra hardware. Due to zero hardware overhead, zero performance penalty, no modification in the design, flexibility in testing and diagnosis and at-speed testing, this method is extremely useful to debug core based system-on-a-chip ICs.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method of evaluating a system-on-a-chip IC (SoC), comprising the following steps of:
    building two or more metal layers to establish a pad frame and internal circuit nodes for each core in an SoC while connecting I/O (input and output) pads on a lower metal layer to a top metal layer, thereby exposing all I/O pads and power pads on a surface of the top metal layer of the pad frame of each core; and
    applying test vector to each core through the I/O pads on the top metal layer of the core and evaluating response outputs of the core received through the I/O pads on the top metal layer;
    wherein the step of building the metal layers of core includes a step of duplicating the internal circuit node in the core to the top metal layer, thereby enabling to electrically contact with the internal circuit node or the I/O pads by contact probes.

2. A method of evaluating a system-on-a-chip (SoC) as defined in claim 1, wherein the step of connecting the I/O pads to the top metal layer includes a step of using metal vias for electrically connecting between a lower metal layer and an upper metal layer of the pad frame, thereby duplicating the I/O pads toward the top metal layer.

3. A method of evaluating a system-on-a-chip (SoC), comprising the following steps of:
    building a chip I/O (input and output) frame at an outer area of an SoC for interfacing with the SoC through contact pads formed thereon;
    building two or more metal layers to establish a pad frame and internal circuit nodes for each core in the SoC while connecting I/O pads on a lower metal layer to a top metal layer, thereby exposing all I/O pads and power pads on a surface of the top metal layer of the pad frame of each core;
    applying test vector to the SoC through the contact pads formed on the chip I/O pad frame and evaluating response outputs of the SoC received through the contact pads on the chip I/O pad frame; and
    applying test vector to each core through the I/O pads formed on the top metal layer of the core and evaluating response outputs of the core received through the I/O pads on the top metal layer;
    wherein the step of building the metal layers of core includes a step of duplicating the internal circuit node in the core to the top metal layer, thereby enabling to electrically contact with the internal circuit node or the I/O pads by contact probes.

4. A method of evaluating a system-on-a-chip (SoC) as defined in claim 3, wherein the step of connecting the I/O pads to the top metal layer includes a step of using metal vias for electrically connecting between a lower metal layer and an upper metal layer of the pad frame, thereby duplicating the I/O pads toward the top metal layer.

5. A method of evaluating a system-on-a-chip (SoC) as defined in claim 3, further comprising the step of removing the I/O pads on the top metal layer of each core after evaluating the SoC.

6. A structure of a system-on-a-chip IC (SoC) for evaluating design integrity thereof, comprising:
    a chip I/O (input and output) frame at an outer area of the SoC for interfacing with the SoC through contact pads formed thereon; and
    two or more metal layers of a pad frame for each core in the SoC where I/O pads on a lower metal layer are connected to a top metal layer, thereby exposing all I/O pads and power pads on a surface of the top metal layer of the pad frame of each core;
    wherein test vectors are applied to the SoC through the contact pads formed on the chip I/O pad frame to evaluate response outputs of the SoC received through the contact pads on the chip I/O pad frame; and
    wherein test vectors are applied to each core through the I/O pads formed on the top metal layer of the core to evaluate response outputs of the core received through the I/O pads on the top metal layer;
    wherein two or more metal layers include internal circuit nodes in the core which are duplicated to the top metal layer, thereby enabling to contact with the internal circuit node or the I/O pads by contact probes.

* * * * *